United States Patent
Song et al.

[11] Patent Number: 6,121,677
[45] Date of Patent: Sep. 19, 2000

[54] REDUCED SIZE INTEGRATED CIRCUITS AND METHODS USING TEST PADS LOCATED IN SCRIBE REGIONS OF INTEGRATED CIRCUITS WAFERS

[75] Inventors: Ho-Sung Song, Kyunggi-do; Ki-Jong Lee, Seoul, both of Rep. of Korea

[73] Assignee: Samsung Electronics Co., Rep. of Korea

[21] Appl. No.: 09/201,613

[22] Filed: Nov. 30, 1998

[30] Foreign Application Priority Data

Dec. 31, 1997 [KR]  Rep. of Korea ............ 97-81004

[51] Int. Cl.[7] .................................................. H01L 23/48
[52] U.S. Cl. ......................... 257/692; 257/786; 257/48
[58] Field of Search .................................... 257/48, 786

[56]  References Cited

U.S. PATENT DOCUMENTS

| | | | |
|---|---|---|---|
| 5,053,700 | 10/1991 | Parrish | 324/158 |
| 5,059,899 | 10/1991 | Farnworth et al. | 324/158 R |
| 5,285,082 | 2/1994 | Axer | 257/48 |
| 5,391,892 | 2/1995 | Devereaux et al. | 257/48 |
| 5,477,062 | 12/1995 | Natsume | 257/48 |
| 5,483,175 | 1/1996 | Ahmad et al. | 324/766 |
| 5,506,499 | 4/1996 | Puar | 324/158.1 |
| 5,896,040 | 4/1999 | Brannigan et al. | 257/118 |
| 5,923,047 | 7/1999 | Chia et al. | 257/48 |

FOREIGN PATENT DOCUMENTS

| | | |
|---|---|---|
| 06349926A | 12/1994 | Japan . |
| 07050326A | 2/1995 | Japan . |
| WO 97/12395 | 4/1997 | WIPO . |

*Primary Examiner*—David Hardy
*Assistant Examiner*—Jhihan B Clark
*Attorney, Agent, or Firm*—Myers Bigel Sibley & Sajovec

[57]  ABSTRACT

Integrated circuit regions are formed on an integrated circuit wafer. The integrated circuit wafer includes scribe regions located between the integrated circuit regions, the scribe regions include test pads that are electrically connected to the test circuits of integrated circuit regions via conductive lines. Test functions are provided to the test circuits in the integrated circuit regions via the test pads to determine the operability of the integrated circuit regions. The integrated circuit regions are separated from the plurality of scribe regions and the plurality of test pads located therein. Separating the integrated circuit regions from the scribe regions and the test pads, thereby may allow a reduction in the number of pads in the integrated circuits and a corresponding decrease in the size of respective integrated circuit packages.

15 Claims, 4 Drawing Sheets

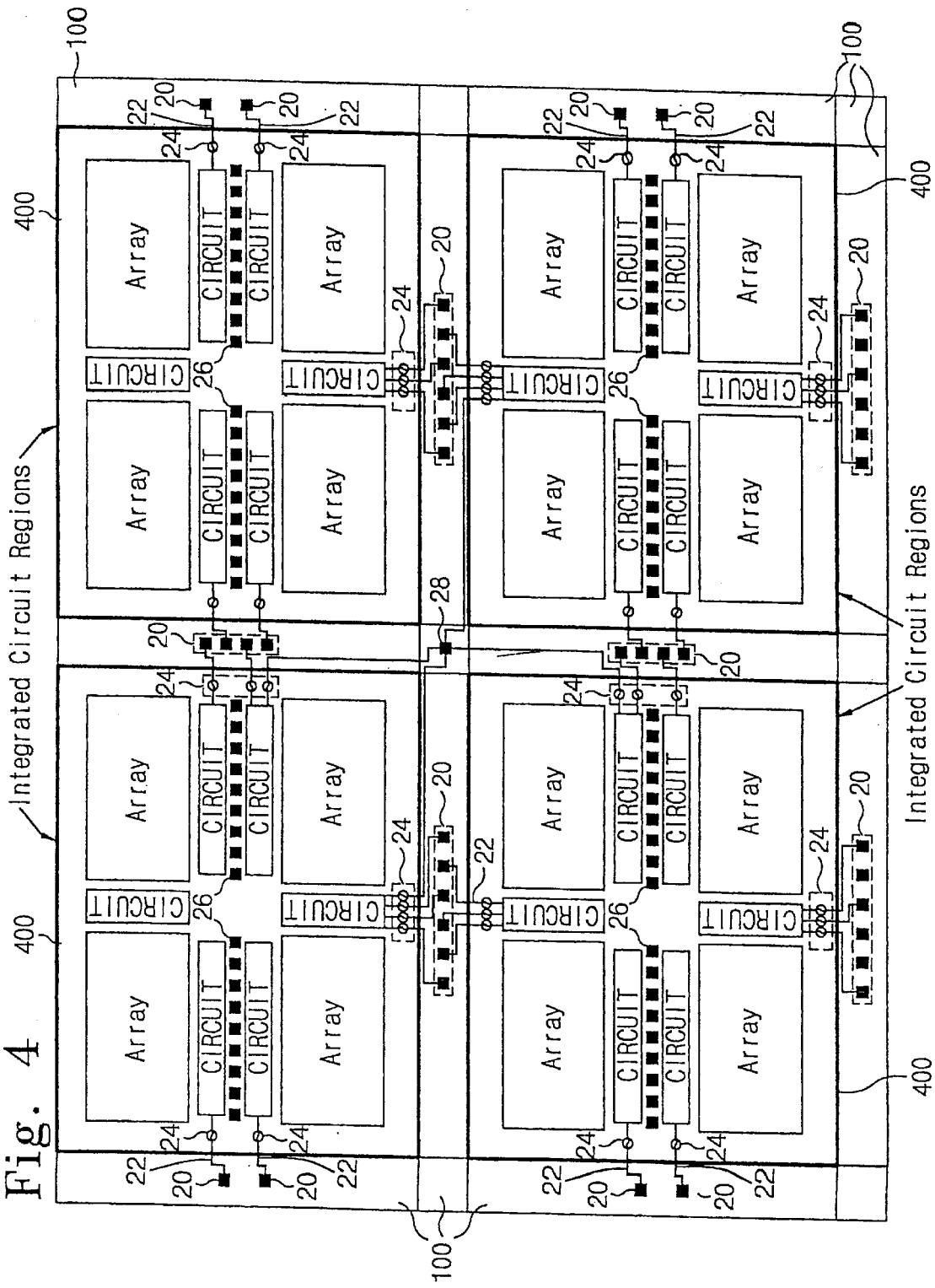

REDUCED SIZE INTEGRATED CIRCUITS AND METHODS USING TEST PADS LOCATED IN SCRIBE REGIONS OF INTEGRATED CIRCUITS WAFERS

FIELD OF THE INVENTION

The present invention relates to the fabrication of integrated circuits and more particularly to the location of pads on integrated circuits.

BACKGROUND OF THE INVENTION

As the level of integration of integrated circuits increases so there may also be a corresponding decrease in the size of components included in the integrated circuits. Some of the factors which contribute to the size of an integrated circuit include the memory cell size, the number of control circuits and the number of pads in the integrated circuit. In particular, the pads included in the integrated circuits may be divided into two groups: bonding pads and test pads. Bonding pads may be used to provide input and output to the integrated circuit in normal operation. Tests pads may provide test functions for the integrated circuit during the fabrication process. For example, the test signals may be applied to the corresponding test pads to initiate a test function in the integrated circuit. After the integrated circuit is fabricated, however, the test pads may not be used.

FIG. 1 is an enlarged schematic diagram that illustrates arrangements of memory cells, control circuits and outer pads in integrated circuit memory devices according to the prior art. According to FIG. 1, as the size of the memory cells 14 and the circuits 16 shown in the top half of FIG. 1 are decreased, the overall size of the integrated circuit region 12 may be decreased as shown in the lower half of FIG. 1. However, the pads 20 may be formed such that further reductions may not be easily achieved. For example, it may be difficult to reduce the pitch between adjacent pads 20 to less than about 20 μm. Consequently, the pads 20 located on opposite sides of the integrated circuit region 12 may not fit into the integrated circuit region 12.

FIG. 2 is an enlarged schematic diagram that illustrates arrangement of memory cells, control circuits, and inner pads in integrated circuit memory devices according to the prior art. According to the upper half of FIG. 2, as the sizes of the memory cells 14 and the control circuits 16 are reduced as shown in the lower half of FIG. 2, the inner pads 20 may not fit on the integrated circuit 12 and may therefore limit the size reduction of the integrated circuit 12. The pads 20 therefore may limit the size reduction of the integrated circuit region 12. Moreover, limitations in the reduction of the integrated circuit region 12 may limit further reductions in the size of the integrated circuit package 10.

In view of the above, there continues to exist a need to further improve integrated circuit wafers and reduce the size of integrated circuit regions and integrated circuit packages.

SUMMARY OF THE INVENTION

It is an object of the present invention to provide improved methods of fabricating integrated circuits.

It is another object of the present invention to allow further reductions in the size of integrated circuits.

It is another object of the present invention to provide improved integrated circuit wafers.

It is another object of the present invention to allow further reductions in the number of test pads in an integrated circuit region.

These and other objects are provided by fabricating an integrated circuit from an integrated circuit wafer including test pads located in areas that are removed from the integrated circuit wafer during fabrication of the integrated circuit. Consequently, the test pads may not be included in the integrated circuit region that is packaged as an integrated circuit device. The present invention thereby may allow a reduction in the size of integrated circuit regions and integrated circuit packages so formed.

According to an aspect of the present invention, integrated circuit regions are formed on an integrated circuit wafer. The integrated circuit wafer includes scribe regions located between the integrated circuit regions. The scribe regions include test pads that are electrically connected to the test circuits of integrated circuit regions via conductive lines. Test functions are provided to the test circuits in the integrated circuit regions via the test pads to determine operability of the integrated circuit regions. The integrated circuit regions are separated from the plurality of scribe regions including the plurality of test pads located therein.

Accordingly, the integrated circuit region may be free of test pads. Consequently, the size of the integrated circuit devices so formed may be reduced. In contrast, according to the prior art, test pads are located in the integrated circuit region and are packaged with the integrated circuit regions to form the integrated circuit devices, thereby possibly limiting the size reductions of the integrated circuit regions and integrated circuit devices.

In another aspect of the present invention, the separation of the integrated circuit region from the scribe regions is preceded by the step of isolating the conductive lines from the test circuits using isolation devices located in the integrated circuit regions. The present invention may thereby reduce the likelihood that the conductive lines may short together when the scribe region is removed. In a preferred embodiment, the isolation devices are fuses that can be cut by a laser beam.

In another aspect of the present invention, an integrated circuit wafer comprises integrated circuit regions on the integrated circuit wafer. The integrated circuit regions include test circuits. Scribe regions, located between the integrated circuit regions, are separated from the integrated circuit regions to create integrated circuits. Test pads, located in the scribe regions, provide test functions for the integrated circuit regions. Conductive lines electrically connect the test pads to the test circuits in the integrated circuit regions.

BRIEF DESCRIPTION OF THE DRAWINGS

FIG. 4 is an enlarged schematic diagram that illustrates an integrated circuit wafer arrangement according to the present invention, as highlighted in FIG. 3.

DETAILED DESCRIPTION OF PREFERRED EMBODIMENTS

Figure 1:
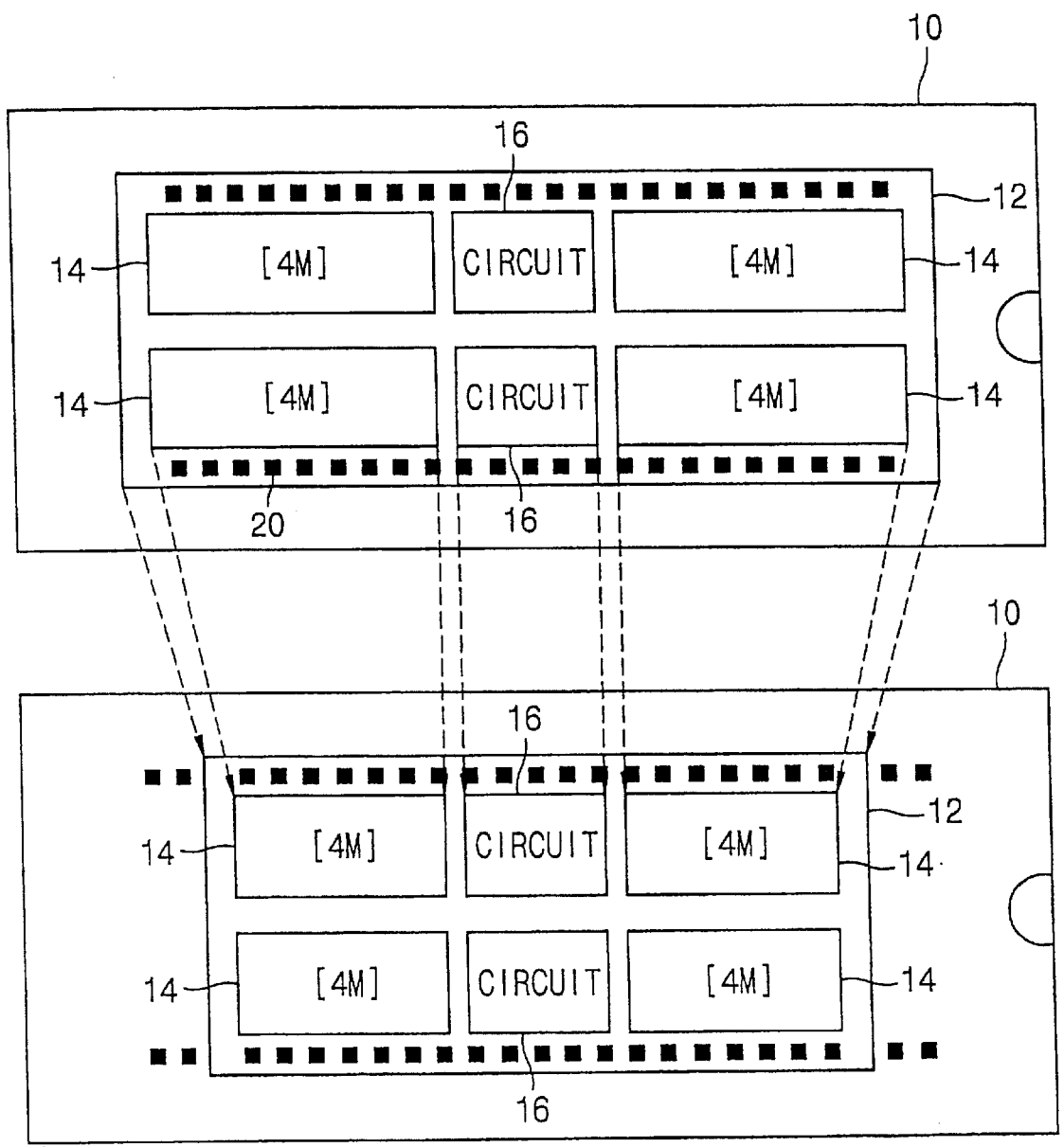
FIG. 1 is an enlarged schematic diagram that illustrates arrangements of memory cells, control circuits and outer pads in integrated circuit memory devices according to the prior art.
Figure 2:
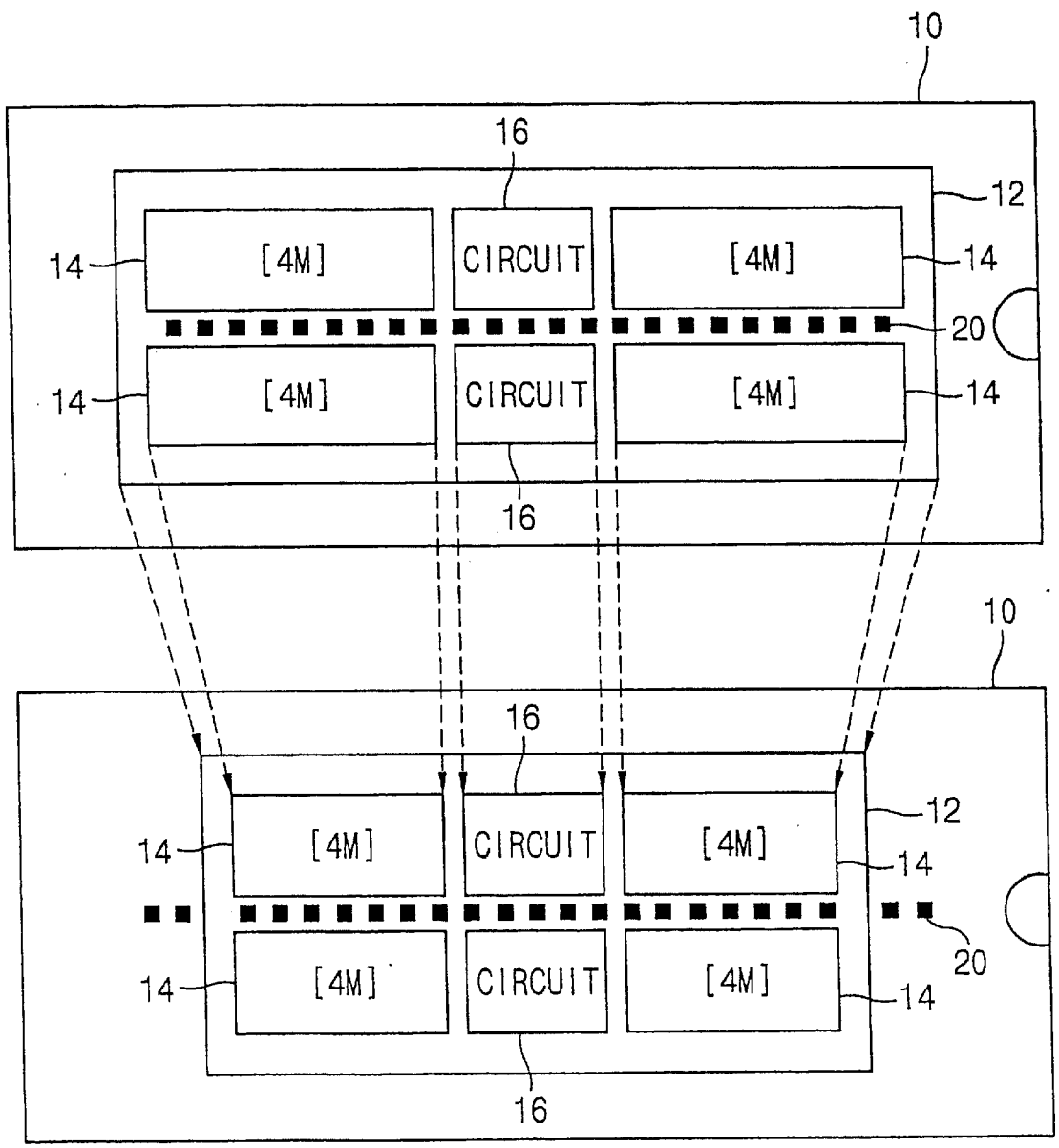
FIG. 2 is an enlarged schematic diagram that illustrates arrangements of memory cells, control circuits and inner pads in integrated circuit memory devices according to the prior art.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the dimensions of regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 3:
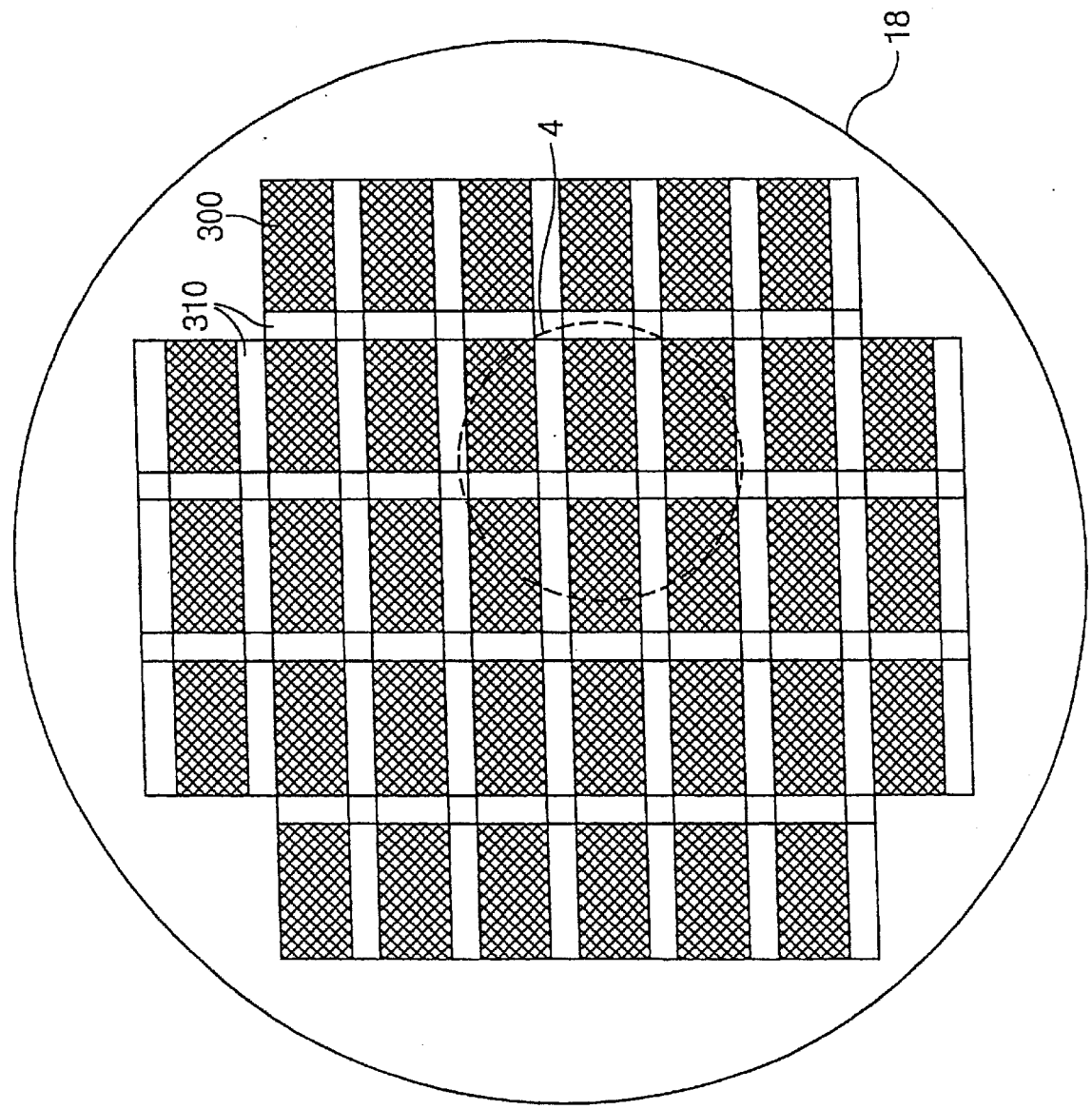
FIG. 3 is a schematic diagram that illustrates an integrated circuit wafer arrangement according to the present invention.

FIG. 3 is an enlarged schematic diagram of an integrated circuit wafer arrangement according to the present invention. According to FIG. 3, the integrated circuit wafer 18 includes integrated circuit regions 300 and scribe regions 310 located therebetween. In particular, the integrated circuit regions 300 are arranged in a pattern on the integrated circuit wafer 18. The scribe regions 310 are arranged between the integrated circuit regions 300 in a row and column configuration. The scribe regions 310 are removed from the integrated circuit wafer 18 so that the integrated circuits within the integrated circuit regions may be packaged as integrated circuit devices.

FIG. 4 is an enlarged schematic diagram that illustrates an integrated circuit wafer layout arrangement according to the present invention, as highlighted in FIG. 3. According to FIG. 4, the highlighted region 4 of the integrated circuit wafer 18 of FIG. 3 includes a plurality of integrated circuit regions 400. The integrated circuit regions 400 are separated vertically and horizontally by a plurality of scribe regions 100 which are removed to separate the plurality of integrated circuit regions 400 to provide separate integrated circuits.

The integrated circuits regions 400 may include memory arrays, test circuits, and bonding pads 26. The bonding pads 26 may be located at the center of the integrated circuit as shown and/or at other location in the adjacent circuit. The test circuits carry out test functions for the integrated circuit regions 400, including monitoring voltage levels produced by the integrated circuit regions 400 to indicate the operability of the integrated circuit region 400 and providing test signals to the integrated circuit regions 400 to carry out test functions during the manufacturing of the integrated circuit devices.

Test pads 20 are located in the scribe regions 100 and are electrically connected to the test circuits located in the integrated circuit regions 400. The test functions and voltage levels may thereby be provided via the test pads 20 to and from the integrated circuit region 400. The connection between the test pads 20 and the test circuits in the integrated circuit regions 400 is provided by conductive lines 22. Bonding pads 26 provide input and output to the integrated circuit regions 400. For example, the bonding pads 26 are connected to pins of the integrated circuit packages in which the integrated circuits are placed.

Isolation devices 24 are located in the integrated circuit regions 400 and in line with the conductive lines 22. The isolation devices 24 connect the test pads 20 to the test circuits in a first state and electrically isolate the test pads 20 from the test circuits in a second state. For example, isolation devices 24 may be fuses that are severed to disconnect test pads 20 from the test circuits in the integrated circuit regions 400.

The isolation devices 24 may be used to isolate the conductive lines 22 from one another to avoid the conductive lines 22 from shorting together when the scribe regions 100 are removed. For example, the isolation devices 24 may isolate conductive lines 22 from one another so that if cutting of the scribe region 100 causes a short between conductive lines 22, the test circuits are unaffected by the short.

During fabrication of integrated circuits, the scribe regions 100 are removed from between the integrated circuit regions 400 thereby creating a plurality of separate integrated circuit regions 400. When the scribe regions 100 are removed, the test pads 20 located therein are also removed. Consequently, the separate integrated circuits need not include test pads 20 when formed. The placement of the test pads 20 in the scribe regions 100 thereby allows a further reduction in the size of the integrated circuit region 400 by removing test pads that are used only during the manufacturing process of the integrated circuit regions 400.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit wafer comprising:
   a plurality of integrated circuit regions on the integrated circuit wafer;
   a plurality of test pads that provide test functions to the plurality of integrated circuit regions, the plurality of test pads being located in a plurality of regions of the integrated circuit wafer that are removed during the fabrication of integrated circuit devices using the plurality of integrated circuit regions; and
   a plurality of isolation devices, located in the plurality of integrated circuit regions, wherein the plurality of isolation devices electrically connect the plurality of test pads to the plurality of test circuits in a first state and electrically isolate the plurality of test pads from the plurality of test circuits in a second state.

2. The integrated circuit wafer of claim 1, wherein the plurality of regions comprises a plurality of scribe regions, located between the plurality of integrated circuit regions, that are separated from the plurality of integrated circuit regions to create a plurality of integrated circuit devices.

3. The integrated circuit wafer of claim 1, wherein the plurality of isolation devices comprise a plurality of fuses.

4. The integrated circuit wafer of claim 1, wherein one of the plurality of test pads is electrically connected to at least two adjacent integrated circuit regions.

5. The integrated circuit wafer of claim 1, wherein the test functions comprise monitoring voltage levels produced by the plurality of test circuits and providing test signals to the plurality of test circuits via the plurality of test pads.

6. The integrated circuit wafer of claim 2 further comprising a plurality of conductive lines that electrically connect the plurality of test pads to a plurality of test circuits in the plurality of integrated circuit regions.

7. A semiconductor device as defined in claim 2, wherein isolation means is further provided for enabling the subsequent disconnection of conductive lines which have been connected with each other at the edges of said chip regions during separation of the said chip regions.

8. A semiconductor device as defined in claim 2, wherein said dummy pads are arranged so that they can be cut away when separating said chip regions.

9. A semiconductor device as defined in claim 6, wherein said isolation means comprises a plurality of fuses each arranged in said chip region between the respective dummy pad and circuit.

10. A semiconductor device as defined in claim 4, wherein isolation means is further provided for enabling the subsequent disconnection of conductive lines which have been connected with each other at the edges of said chip regions during separation of the said chip regions, said isolation means comprising a plurality of fuses each arranged in said chip region between the respective dummy pad and circuit.

11. A semiconductor device comprising:
   a plurality of chip regions formed on a wafer;
   a plurality of scribe line regions formed on said wafer between the said chip regions;
   a plurality of bonding pads provided in each of said chip regions; and
   a plurality of dummy pads for receiving rest signals when testing said chips and arranged in said scribe line regions so as to be respectively electrically connected with said chip regions;
   wherein each said dummy pad is arranged to supply one of the said test signals to two or more adjacent said chip regions in common.

12. A semiconductor device comprising:
   a plurality of chip regions formed on a wafer with a prescribed interval between them, each of said chip regions mounting a chip provided with a circuit for generating an internal voltage;
   a plurality of bonding pads provided in each of said chip regions;
   a plurality of dummy pads for receiving test signals when testing said chips and respectively connected with said chips for enabling detection of the respective internal voltage of said chips; and
   a plurality of conductive lines for electrically connecting said dummy pads with the respective circuits generating internal voltages;
   wherein said dummy pads are arranged in the regions between said chip regions; and
   wherein each said dummy pad is arranged to supply one of the said test signals to two or more adjacent said chip regions in common.

13. A semiconductor device comprising:
   a plurality of chip regions formed on a wafer with a prescribed interval between them, each of said chip regions mounting a chip;
   a plurality of bonding pads provided in each of said chip regions;
   a plurality of scribe line regions formed on said wafer;
   a plurality of dummy pads for receiving test signals when testing said chips; and
   a plurality of conductive lines for electrically connecting said dummy pads with the respective ones of said chips;
   wherein said dummy pads are arranged in said scribe line regions; and
   wherein each said dummy pad is arranged to supply one of the said test signals to two or more adjacent said chip regions in common.

14. A semiconductor device comprising:
   a plurality of chip regions formed on a wafer to respectively mount chips each provided with a circuit for generating an internal voltage;
   a plurality of scribe line regions formed on said wafer;
   a plurality of first dummy pads respectively arranged in said scribe line regions to enable detection of the respective internal voltages of said chips;
   a plurality of second dummy pads respectively arranged in said scribe line regions to receive test signals to test said chips; and
   a plurality of conductive lines for electrically connecting said first dummy pads with the respective circuits generating different internal voltages, and said second dummy pads with the respective chips;
   wherein each said second dummy pad is arranged to supply one of the said test signals to two or more adjacent said chips in common.

15. A semiconductor device as defined in claim 14, wherein isolation means is further provided for enabling the subsequent disconnection of conductive lines which have been connected with each other at the edges of said chip regions during separation of the said chip regions, said isolation means comprising a plurality of fuses, each arranged in a said chip region between a respective dummy pad and circuit.

* * * * *